United States Patent [19]

Yokobori

[11] Patent Number: 4,535,276

[45] Date of Patent: Aug. 13, 1985

[54] OUTPUT CIRCUIT AND BRUSHLESS MOTOR USING THE SAME

[75] Inventor: Nobuyoshi Yokobori, Osaka, Japan

[73] Assignee: Matsushita Electric Industrial Co., Ltd., Kadoma, Japan

[21] Appl. No.: 569,762

[22] Filed: Jan. 10, 1984

[30] Foreign Application Priority Data

| Jan. 12, 1983 | [JP] | Japan | 58-3675 |
| Jan. 24, 1983 | [JP] | Japan | 58-10405 |
| Jan. 25, 1983 | [JP] | Japan | 58-10698 |
| Jan. 26, 1983 | [JP] | Japan | 58-11858 |
| Jan. 27, 1983 | [JP] | Japan | 58-12318 |
| Jan. 28, 1983 | [JP] | Japan | 58-13054 |

[51] Int. Cl.³ .......................... H02P 6/02; G05F 1/56
[52] U.S. Cl. ..................................... 318/254; 318/138; 318/439; 323/277; 323/315
[58] Field of Search ............... 323/260, 277, 280, 281, 323/315, 323, 349; 318/254 A, 254, 439, 138

[56] References Cited

U.S. PATENT DOCUMENTS

| 3,714,512 | 1/1973 | Grabowski | 323/277 X |
| 3,723,774 | 3/1973 | Rogers | 323/277 X |
| 4,035,700 | 7/1977 | Kawasaki et al. | 318/254 X |
| 4,315,207 | 2/1982 | Apfel | 323/284 |
| 4,376,261 | 3/1983 | Heide et al. | 318/254 |
| 4,442,397 | 4/1984 | Ishikawa et al. | 323/349 X |
| 4,447,771 | 5/1984 | Whited | 318/254 X |

FOREIGN PATENT DOCUMENTS

| 54-125418 | 9/1979 | Japan | 318/254 |
| 58-99289 | 6/1983 | Japan | 318/254 |

Primary Examiner—William M. Shoop
Assistant Examiner—Bentsu Ro
Attorney, Agent, or Firm—Wenderoth, Lind & Ponack

[57] ABSTRACT

An output circuit to drive a current into a load. Collector voltage of a current controlling transistor is automatically adjusted to maintain $h_{FE}$ of the transistor constant, whereby saturation of the transistor and excessive power consumption are avoided. A brushless motor using the output circuit. Current detectors detect emitter current and base current of output transistors and $h_{FE}$ of the transistors are kept constant, whereby excessive torque loss and harmful vibration are avoided. A limiter limits excessive torque control to prevent power transistor saturation. A switching mode power supply adjusts the collector voltage of the transistor in a feedback loop to keep $h_{FE}$ constant.

9 Claims, 13 Drawing Figures

OUTPUT CIRCUIT AND BRUSHLESS MOTOR USING THE SAME

BACKGROUND OF THE INVENTION

This invention relates to an output circuit for feeding a current to an electromagnet, an electromagnetic actuator, or a linear motor.

Furthermore, this invention relates to a brushless motor usable for a tape recorder, a record player, a video tape recorder, etc.

A drive circuit of this type is well-known and includes an output transistor, a current detecting resistor, and a comparator to keep the output transistor non-saturated. The output transistor is a current control transistor, whose emitter current is detected by a current detecting resistor. An error between the current command signal and the current detecting signal is amplified by a differential amplifier to drive the base of transistor, thereby allowing the emitter current to flow up the current command signal. The collector of the transistor connects with a load, and the transistor and amplifier control voltage of load at the power source side so that the collector voltage follows up the reference supply voltage in order to save power consumption of transistor and avoid saturation of transistor, the reference supply voltage is set to a proper value, whereby an operating point where the transistor is not saturated.

Furthermore, the output circuit in the prior art has been used for a conventional brushless motor. Next, explanation will be given on an example of conventional brushless motor which switches a 3-phase armature current by the transistor and controls a generated torque by a command input.

The rotational positions of multipolar-magnetized permanent magnet rotor and windings $L_1$ to $L_3$ of 3-phase armature windings are detected by a position detector and transmitted to two position-signal-switching circuits. The position signal switching circuits each are of 3-differential construction and connected to the base of each transistor in a group of two sets of output transistors different in electric conductivity and the collectors thereof correspond to each other, the group of two sets of transistors having the emitters connected in common and the collectors which are connected at the phases corresponding to each other so as to be of push-pull construction and which are connected to the corresponding phases at the armature windings respectively. The common emitter at one group of output transistors is connected to the power source and that at the other group of the same is grounded through a resistor. Voltage at the terminal connecting with no resistor is applied into one input for a current output type differential amplifier and torque command voltage is applied to the output of differential amplifier, and an output thereof is applied to a first position signal switching circuit of current mirror system. The other ends of armature windings are connected in common and connected to one input of second differential amplifier, the other input thereof being applied with a half of supply voltage by a voltage divider. The output of second differential amplifier is applied in a current mirror system to the first position signal switching circuit. The armature windings are controlled by torque command voltage, whereby torque generated by the motor is controlled by the torque command voltage. On the other hand, the common node of windings $L_1$, $L_2$ and $L_3$ is kept in a half of supply voltage by a negative feedback circuit according to the second differential amplifier. Hence, potential of armature winding changes around a value of half of supply voltage and the two sets of transistor groups operate at about equal emitter-collector voltage, whereby in case where the torque command voltage or the number of rotations of motor increase to increase voltage across both ends of the respective windings $L_1$ to $L_3$, the two sets of transistor groups will be saturated to an about equal extent to thereby improve the utilization factor.

The supply voltage is set high enough not to saturate the two sets of transistor groups in order to obtain the generated torque necessary for the start and rotation of motor. Here, between the collector and the emitter is applied voltage of the remainder of substracting from the supply voltage the sum of voltage drop of resistor, voltage drop by DC resistance of windings $L_1$ to $L_3$, and counter-generated voltage of windings $L_1$ to $L_3$ accompanied by rotations thereof. However, when the armature current is small or the number of rotations of motor is small, voltages of transistor group, collector and emitter, become high and power consumption of each transistor group increases, thereby causing the inconvenience of large power loss.

Also, in a case where the supply voltage is lowered, either one of transistor groups is saturated, at which time the base current flows also in the transistor inherently to be non-conductive so that an armature current harmful to the torque generated by motor flows in the transistor, thereby creating the inconvenience of generating a torque loss or abnormal vibrations.

In order to eliminate the above inconvenience, the supply voltage is controlled to allow the collector voltage at the transistor group to follow the reference voltage.

Such prior art, however, has a serious defect such that voltage across the collector and emitter of transistor not-saturated changes due to a load current, a temperature of transistor, or variation in transistors, whereby the reference voltage should be set higher, or follow the factor of variation. When the reference voltage is set higher, $V_{CE}$ of transistor becomes high to increase power consumption. Also, the circuit construction becomes complicated for allowing the reference voltage to follow the factor of variation, which leads to a high manufacturing cost, thereby being industrially disadvantageous.

The above has been a grave defect with respect to miniaturization and power consumption saving for the machinary utilizing the brushless motor.

SUMMARY OF THE INVENTION

An object of the invention is to provide a current output circuit which can control a load current by control transistors of minimum power consumption to eliminate the aforesaid conventional defect.

Another object of the invention is to provide a brushless motor less in number of wires to thereby raise resistance against variations in elements to be suitable for integration of a drive circuit.

Still another object of the invention is to provide a brushless motor which regulates the relation between the armature current and the torque command voltage regardless of a current value, thereby being suitable for generating an accurate torque by the motor.

A further object of the invention is to provide a brushless motor which steadily prevents an output transistor from being saturated, thereby reducing power consumption of output transistor and eliminating an unnecessary torque loss and abnormal vibrations.

The output circuit of the invention is provided with a voltage control means connected to one end of a load, a current control transistor connected to the other end of the load, a first current detecting means for detecting the emitter current of the current control transistor, a first amplifier which amplifies an error between an output signal from the first current detecting means and the current command signal, a distributor which distributes the output of first amplifier to the base of the current control transistor and the second current detecting means, and a second amplifier which amplifies a difference between the output signals from the first and second current detecting means, so that the output of second amplifier controls the voltage control means.

Such construction can always keep a constant ratio of the emitter current to the base current of current control transistor and also output a current following the current command signal while always keeping the operating point in the minimum voltage between the collector and the emitter.

Also, the brushless motor of the invention is provided with, a multipole magnetized permanent magnet rotor, armature windings of plural phases and connected at one ends in common, a position detector for detecting the rotational positions of the rotor and armature windings, pairs of push pull output transistors connected to the respective phases of the armature windings and equal in number to the phases, a switching mode power supply for variable output voltage and interposed in series in a current passage of the respective armature windings, a first current detecting means for detecting a current in the respective armature windings, a first amplifier for amplifying a difference between the output signal of the first current detecting means and the motor torque command input signal, a first position signal switching means which switches the output of first amplifier corresponding to the output of position detector to thereby decide the exciting phase of the armature winding by one transistor group at the pairs of output transistor, a second current detecting means which outputs a signal corresponding to the base current at the one transistor group, a second amplifier for amplifying a difference between the output signals of the first and second current detecting means, a second position switching means which switches the output of the second amplifier corresponding to the output of position detector to thereby decide the exciting phase of armature windings by the other transistor group at the pair of output transistor, a third current detecting means which outputs a signal corresponding to the base current at the other transistor group, and a third amplifier for amplifying a difference between the output signals of the first and third current detecting means, the second amplifier controlling the conductive condition of the other transistor group so as to keep a constant ratio of the base current at one transistor group to the current flowing in the first current detecting means, and the output signal of third amplifier controlling the output voltage of switching mode power supply so that the ratio of the base current at the other transistor group to a current flowing in the first current detecting means is kept constant, whereby a torque corresponding to the torque command input signal is generated. Hence, the output transistor suppresses a power loss to a minimum to prevent its saturation, and to thereby eliminate unnecessary torque loss or abnormal vibration.

The above and other objects and features of the invention will become more apparent in the following detailed description with the accompanying drawings in which:

DETAILED DESCRIPTION OF THE PREFERRED EMBODIMENTS

Figure 1:
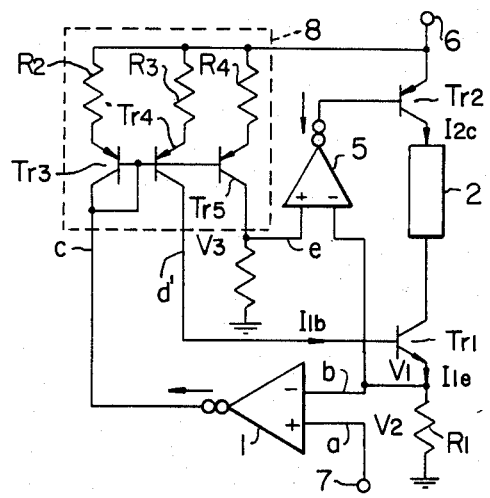
FIG. 1 is a circuit diagram of a preferred embodiment of an output circuit of the invention.

Next, an embodiment of an output circuit of the invention will be shown in FIG. 1, in which a load 2 is connected between the collectors of NPN transistor $Tr_1$ and PNP transistor $Tr_2$, the emitter of transistor $Tr_1$ being grounded through a current detecting resistance $R_1$ and connected to the input end at the inversion side of current output type differential amplifiers 1 and 5. An output signal c of amplifier 1 is connected to the collector of PNP transistor $Tr_3$ in diode connection, the bases of PNP transistors $Tr_4$ and $Tr_5$ both being connected to the base of transistor $Tr_3$, the emitters of transistors $Tr_3$ to $Tr_5$ being connected to a power supply through the resistances $R_2$ to $R_4$, thereby enabling construction of current mirror. The collector of transistor $Tr_4$ is connected to the base of transistor $Tr_1$, the collector of that $Tr_5$ being grounded through a current detection resistance $R_5$ and to the input end at the not-inversion side of amplifier 5. The base of transistor $Tr_2$ is connected to the output end of amplifier 5, the emitter of the same being connected to the power supply terminal 6, the input end at the non-inversion side of amplifier 1 being connected to the input terminal 7 for the load current command signal.

Next, explanation will be given on operation of the output circuit. The emitter current $I_{1e}$ of transistor $Tr_1$ flows in a resistance $R_1$ to generate voltage $V_1$, i.e. $V_1 = I_{1e} \times R_1$. A difference between the voltage $V_1$ and the voltage $V_2$ at the input terminal 7 is amplified by the amplifier 1 and the current of output c is distributed into outputs d and e by a current distributor 8 comprising transistors $Tr_3$ through $Tr_5$. The output d of a value of $I_{1b}$ is applied to the base of the transistor $Tr_1$ to form a negative feedback loop b→c→d→b so that $V_1$ is controlled to become $V_2$ which is a load current command signal a. That is, $I_{1e}$ is controlled to become $V_2/R_1$ (where the loop gain is supposed to be large enough). Although this feedback loop does not include the collector of $Tr_1$, it is affected by the collector current $I_{1c}$ of the transistor $Tr_1$. The base current $I_{1b}$ depends on the collector current, i.e., $$I_{1b}=I_{1e}-I_{1c}=V_2/R_1-I_{1c}$$

This means if $I_{1c}$ decreases because of a reduction of the collector-emitter voltage or a saturation of $Tr_1$, then $I_{1b}$ increases. When $I_{1b}$ increases, however, the current from the output e increases, that is, the voltage $V_3$ also increases, which results in that the output of the amplifier 5 increases and hence the collector current $I_{2c}$ of the transistor $Tr_2$ increases. The current $I_{2c}$ flows into the collector of $Tr_1$ through the load 2. Therefore, the collector current $I_{1c}$ increases, which results in that the base current $I_{1b}$ decreases. This loop is also a negative feedback loop. So, there are two feedback loops; the first feedback loop controls the load current in accordance with the command signal a, and the second feedback loop controls the relationship between the base current $I_{1b}$ and the collector current $I_{1c}$ of the transistor $Tr_1$, thereby making the voltages $V_1$ and $V_3$ equal to each other.

When the current values of d and e from the current distributor 8 are equal to each other, the voltage $V_3$ of resistance $R_5$ is given by:

$$V_3=I_{1b}\times R_5$$

Therefore, $$I_{1e}\times R_1=I_{1b}\times R_5$$

On the other hand, the current amplification factor ($h_{FE}$) of the transistor $Tr_1$ is represented by $h_{FE}=I_{1c}/I_{1b}$. Using the relationship of $I_{1e}=I_{1b}+I_{1c}$, $h_{FE}$ is written as follows:

$$h_{FE}=I_{1e}/I_{1b}-1=R_5/R_1-1$$

This relationship means that the $h_{FE}$ of $Tr_1$ is controlled so as to be a constant value given by the resistors $R_1$ and $R_5$ by the two feedback loops.

Figure 2:
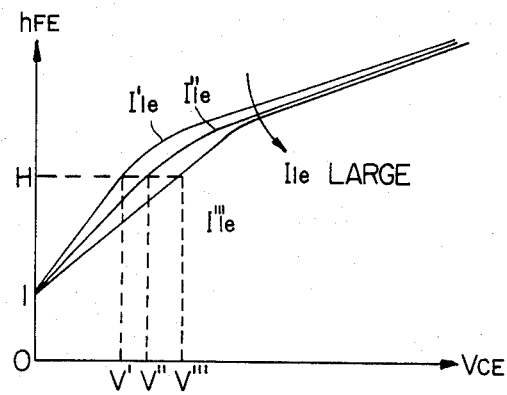
FIG. 2 is a graph explanatory of the relation $V_{CE}$ and $h_{FE}$ of a current control transistor.
Figure 3:
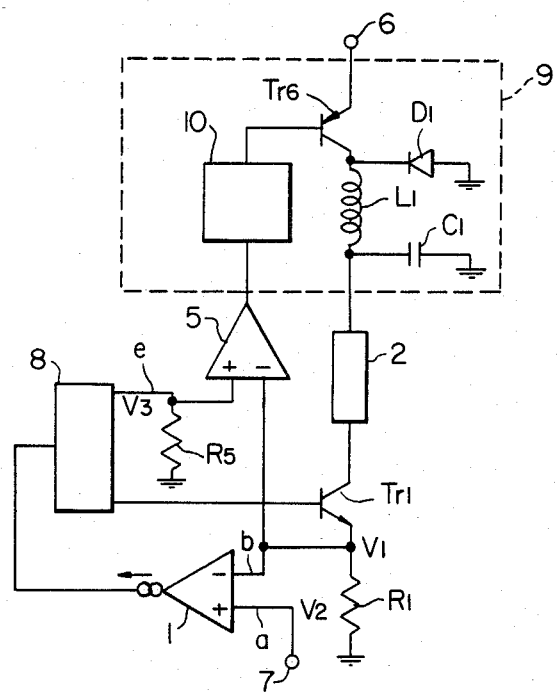
FIG. 3 is a circuit diagram of a modified embodiment of the output circuit of the invention.

FIG. 2 is a graph of relation between $V_{CE}$ and $h_{FE}$ of transistor $Tr_1$ using $I_1e$ as a parameter. As seen from FIG. 2, when $h_{FE}$ is kept constant, the larger the $I_1e$, the higher the $V_{CE}$, which indicates that proper selection of $h_{FE}$ eables the transistor $Tr_1$ to operate at the operating point just before saturation. For example, assuming that $h_{FE}$ is constant at H and when $I_1e$ is $I'_1e$, $V_{CE}$ just before saturation is $V'$, $V_{CE}$ increases up to $V''$ when $I_1e$ increases up to $I''_1e$, and $V_{CE}$ increases to become $V'''$ when $I_1e$ becomes $I'''_1e$, whereby the transistor always operates just before the operating point. Such condition changes automatically corresponding to variations in the elements and the temperature thereof. Hence, the values of $R_5$ and $R_1$ are properly selected so as to maintain a minimum $V_{CE}$ of transistor $Tr_1$, thereby greatly reducing the power consumption of transistor $Tr_1$. Also, the ratio of emitter resistance $R_2$ to $R_4$ of the current mirror is changed to enable the distribution ratio of distributor 8 to be changed, thereby enabling desired setting of $h_{FE}$ together with the ratio of $R_5$ to $R_1$.

The output of amplifier 5 is connected to a control circuit 10 of a switching mode power supply 9. The control circuit 10 is connected to a base of a switching transistor $Tr_6$, collector and emitter thereof being connected to a cathode of a diode $D_1$ and a power supply 6, respectively. The anode of the diode $D_1$ is grounded. A coil $L_1$ is connected to the cathode of the diode $D_1$ at one end and to a grounded capacitor $C_1$ and the load 2 at the other end.

Now, when output voltage of switching mode power supply 9 is low and $V_{CE}$ of transistor $Tr_1$ low, the output of amplifier 5 increases in the same manner as the abovementioned, the output driving the control circuit 10 to prolong the "on" time period of transistor $Tr_6$ and raise output voltage of switching mode power supply 9. Hence, the negative feedback loop is constructed; $V_{CE}$ of transistor $Tr_1$ is held to the value of constant $h_{FE}$ depending on the distributor 8, and resistances $R_5$ and $R_1$, whereby the power consumption of transistor $Tr_1$ is reduced to a minimum value so as to supply a sufficient output current to the load 2.

Figure 4:
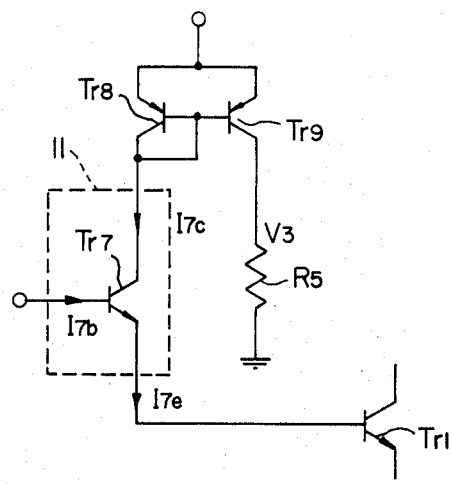
FIG. 4 is a circuit diagram of a distributor shown in the FIG. 3 embodiment.

FIG. 4 shows another example of the distributor used in this invention, in which a transistor $Tr_7$ constitutes a distributor 11 and an input is given to the base of transistor $Tr_7$, the emitter thereof being connected to the base of transistor $Tr_1$, the collector of the same being connected to the bases of current mirror transistors $Tr_8$ and $Tr_9$, the collector thereof being grounded through a resistance $R_5$. When the base current of transistor $Tr_7$ is represented by $I_{7b}$, the emitter current by $I_{7e}$, the collector current by $I_{7c}$, and the current amplification factor by $h_{FE7}$, the following equations are given:

$$I_{7e}=(1+h_{FE7})I_{7b}$$

$$V_3=h_{FE7}\cdot I_{7b}\times R_5.$$

Accordingly, $$V_3 = \frac{h_{FE7}}{1 + h_{FE7}} \cdot I_{7e} \cdot R_5$$

is obtained, whereby $V_{CE}$ of transistor $Tr_1$ can be set to a minimum in the same manner as noted above with respect to FIG. 1.

Figure 5:
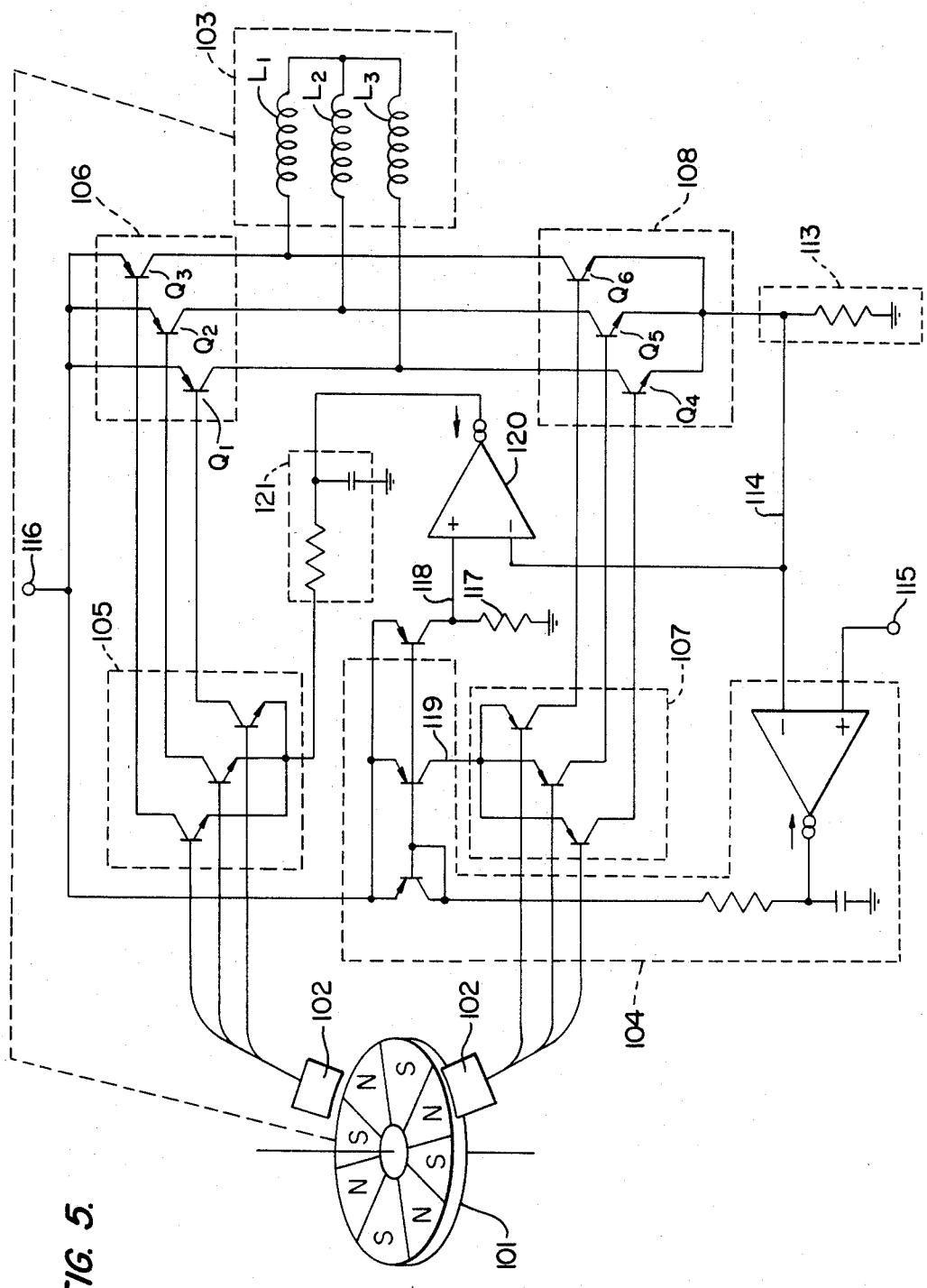
FIGS. 5 to 9 are circuit diagrams of embodiments of brushless DC motors of the invention.

Referring to FIG. 5, an embodiment of a brushless motor of the invention employing the aforesaid output circuit will be shown.

In the drawing, a permanent magnet rotor 101 is magnetized in 8 poles and a 3-phase armature winding 103 is constituted of windings $L_1$, $L_2$ and $L_3$ connected at one ends in common. The rotational positions of rotor 101 and armature winding 103 are detected by a position detector 102 and applied as the 3-phase signal to position signal switching circuits 105 and 107, the position signal switching circuit 105 being of 3-differential constitution of NPN transistors and driving an output transistor group 106, the position signal switching circuit 107 being of 3-differential constitution of PNP transistors and driving an output transistor group 108. The output transistor group 106 comprises, transistors $Q_1$, $Q_2$ and $Q_3$ connected at the emitters in common to a power supply 116, the output transistor group 108 comprising NPN transistors $Q_4$, $Q_5$ and $Q_6$ connected at the emitters in common a current detecting resistance 113. The transistors $Q_1$ and $Q_4$, $Q_2$ and $Q_5$, and $Q_3$ and $Q_6$ are of push pull construction and the collectors are connected with each other and in common to the windings $L_3$, $L_2$ and $L_1$ respectively. Torque command voltage 115 is applied to the input (+) at the non-inversion side of a differential amplifies circuit 104 having two current output terminals 118, 119 by the current mirror, voltage of terminal 114 of resistance 113 being applied to the input at the inversion side. The output terminals 119 are connected to the common emitter of position signal switching circuit 107, the output terminal 118 being connected to the input at the non-inversion side of differential amplifier 120 together with a resistance 117 whose one end is grounded. The input at the inversion side of differential amplifier 120 is connected to the non-grounded end of resistance 113 and the output of the same is connected to the emitter of position signal switching circuit 105 through a low-pass filter 121.

Next, explanation will be given on operation of the circuit. An armature current flows in the route of output transistor group 106→windings 103→output transistor group 108→resistance 113 and is controlled by the negative feedback loop comprising the differential amplifier 104, position signal switching circuit 107, output transistor group 108 and resistance 113 so that the torque command signal becomes equal to voltage across both ends of resistance 113. Therefore, the intensity of armature current depends on the resistance value of torque command voltage-resistance 113. Now, from the positional relation between the rotor 101 and the armature windings 103, when the transistors $Q_3$ and $Q_4$ only among the output transistors $Q_1$ through $Q_6$ are assumed to be in a conductive condition, the emitter current of transistor $Q_4$ only flows in the resistance 113, and the base current of transistor $Q_4$ is given from the current output terminal 119 at the differential amplifier 104 and the resistance 117 is given a current of equal intensity also from the current output terminal 118.

When the values of resistances 113 and 117 are represented by $R_{113}$ and $R_{117}$ and values of current flowing therein by $I_{113}$ and $I_{117}$, input voltage $V_{120}$ to differential amplifier 120 is given by the following equation:

$$V_{120} = R_{117} \cdot I_{117} - R_{113} \cdot I_{113} \quad (1).$$

On the other hand, when the current amplification factor of transistor $Q_4$ is represented by $h_{FE}$, the following equation is given:

$$I_{113} = (1 + h_{FE}) \cdot I_{117} \quad (2).$$

By substituting the equation (2) into (1), $$V_{120} = \left( \frac{R_{117}}{1 + h_{FE}} - R_{113} \right) \cdot I_{113} \quad (3)$$

is obtained. Since $h_{FE}$ of transistor $Q_4$ changes following the collector-emitter voltage $V_{CE}$ as shown in FIG. 2, when the negative feedback loop composed of the differential amplifier 120, low-pass filter 121, position signal switching circuit 105, output transistor $Q_3$, windings $L_1$ and $L_3$, output transistor $Q_4$ and resistance 113, is sufficiently high in loop gain, the collector-emitter operating voltage of transistor $Q_4$ is automatically adjusted so that input voltage $V_{120}$ becomes zero. Therefore, from the equation (3), $$h_{FE} = R_{117}/R_{113} - 1 \quad (4)$$

is obtained. Since the right side of equation (4) is constant, $h_{FE}$ of transistor $Q_4$ becomes constant. When the torque command voltage changes, the emitter current of transistor $Q_4$ changes and the collector-emitter voltage at the transistor $Q_4$ also changes automatically as seen from FIG. 2. In other words, the collector emitter voltage of the transistor $Q_4$ is automatically controlled corresponding to the emitter current so that the current amplification factor is kept constant, whereby voltage across both ends of windings $L_1$ and $L_3$ is adjusted corresponding to the armature current, whereby the motor operates stably.

Even when the rotational positions of rotor 101 and armature windings 103 change so that the conductive transistors among those $Q_1$ to $Q_6$ change, operating voltages of windings $L_1$, $L_2$ and $L_3$ change stably correspondingly to the winding currents as the same as the abovementioned.

Figure 6:
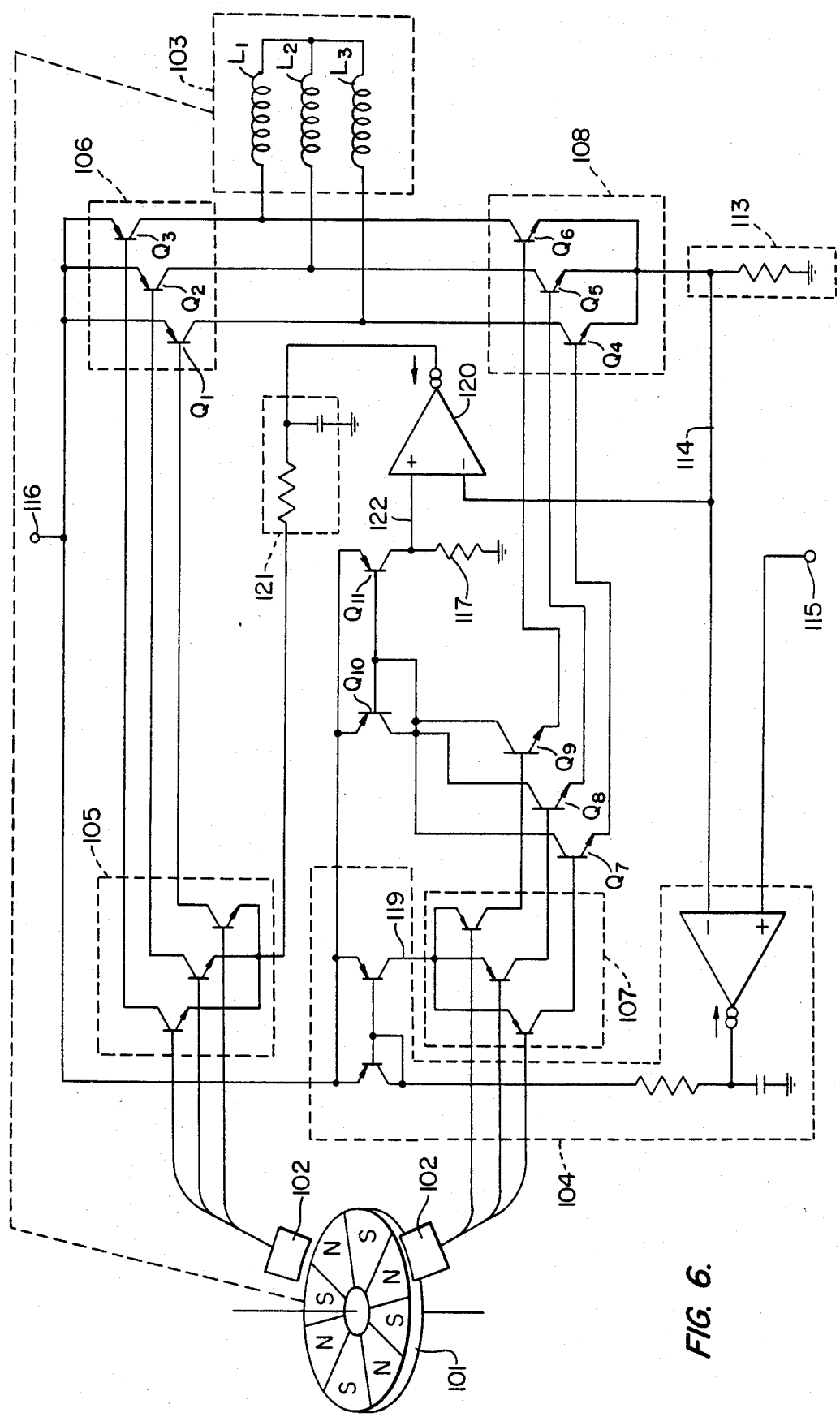

FIG. 6 shows a modified embodiment of the invention, in which the emitters of transistors $Q_7$, $Q_8$ and $Q_9$ are connected to the base of those $Q_4$, $Q_5$ and $Q_6$, the collector are connected in common and to the collector of a transistor $Q_{10}$ which is diode-connected to constitute the current mirror together with a transistor $Q_{11}$, the collector thereof being connected as the output 122 of current mirror to the resistance 117 and input at the non-inversion side of differential amplifier 120, the bases of transistors $Q_7$ through $Q_9$ being connected to the phase corresponding to the position signal switching circuit 107. In FIG. 6, components other than the above are the same as in FIG. 5 to thereby omit its description.

The base currents in the transistors $Q_4$ to $Q_6$ are coincident with the emitter currents in the transistors $Q_7$ to $Q_9$. Since the transistors $Q_7$ through $Q_9$ are emitter followers, the current amplification factor is large enough to be assumed to be the collector current. The collector currents are united and inverted in the current direction by the current mirror and applied to the resistance 117. As a result, at both ends of resistance 117 is generated voltage corresponding to the base currents of transistors $Q_4$ through $Q_6$, whereby the negative feedback loop, as the same as in the first embodiment, will decide the collector operating voltage of transistors $Q_4$ through $Q_6$.

Figure 7:
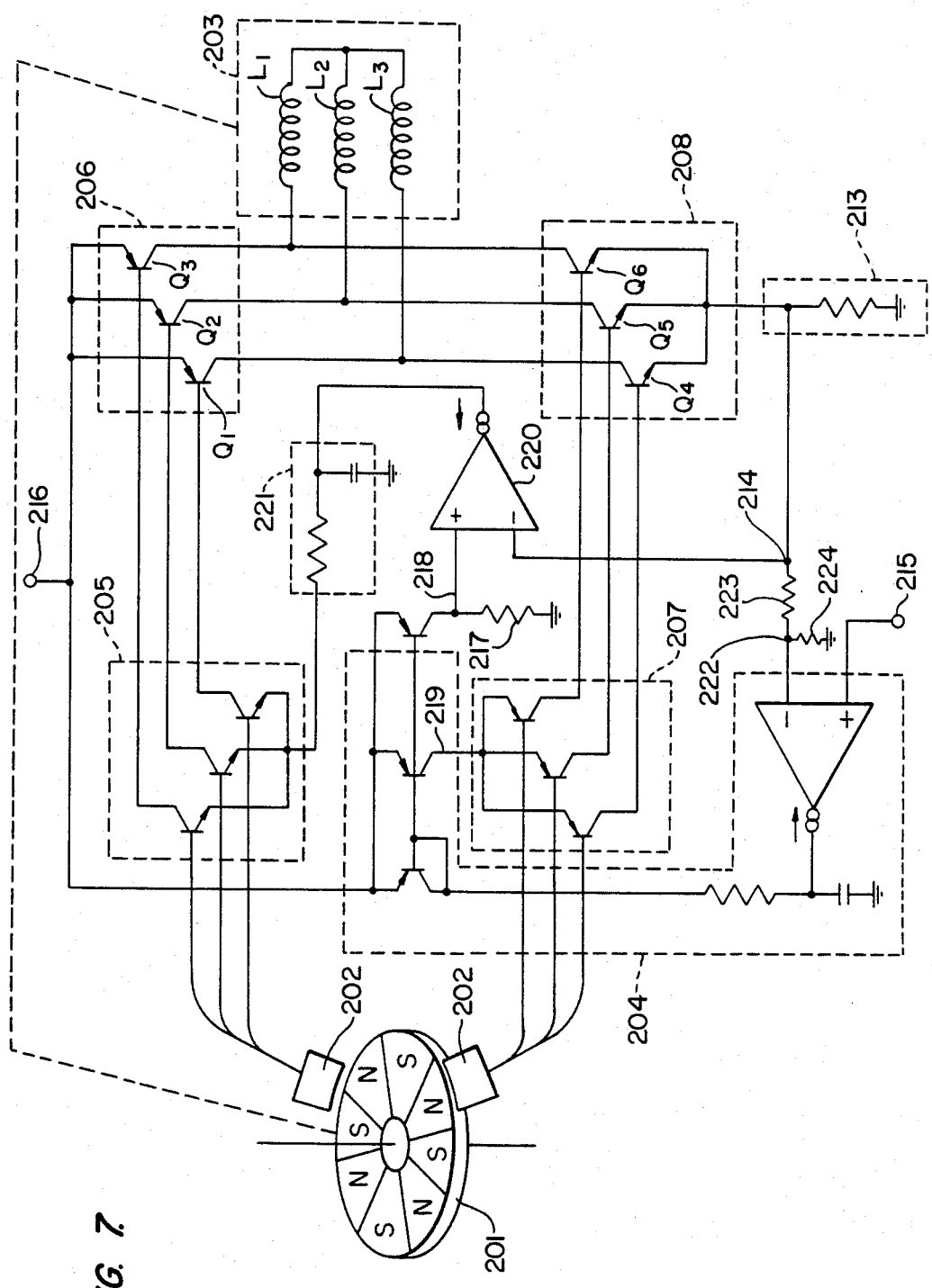

Another modified embodiment of the invention is shown in FIG. 7, in which a permanent magnet rotor 201 is magnetized into 8 poles and 3-phase armature windings 203 comprise windings $L_1$, $L_2$ and $L_3$ connected at one ends in common. The rotational positions of rotor 201 and armature windings 203 are detected by a position detector 202 and applied as the 3-phase signal to position signal switching circuits 205 and 207, the position signal switching circuit 205 being of 3-differential construction by NPN transistors to drive an output transistor group, the position signal switching circuit 207 being of 3-differential constitution by PNP transistors to drive an output transistor group 208. The output transistor group 206 comprises PNP transistors $Q_1$, $Q_2$ and $Q_3$ connected at the emitters in common to a power supply 216, the output transistor group 208 comprising NPN transistors $Q_4$, $Q_5$ and $Q_6$ connected at the emitters in common to a current detecting resistor 213. The transistors $Q_1$ and $Q_4$, $Q_2$ and $Q_5$, and $Q_3$ and $Q_6$ are of push-pull construction and connected at the collectors with each other and in common to windings $L_3$, $L_2$ and $L_1$ respectively. Torque command voltage 215 is applied to the input (+) at the non-inversion side of a differential amplifying circuit 204 having two current output terminals 218 and 219 from the current mirror and voltage of resistor 213 is divided by a voltage divider comprising to resistances 223 and 224 so that the divided voltage 222 is adapted to be applied to the input (−) at the inversion side. The output terminal 219 is connected to the common emitter at the position signal switching circuit 207, the output terminal 218 being connected, together with a resistance 217 grounded at one end, to the input at the non-inversion side of differential amplifier 220. The input at the inversion side of differential amplifier 220 is connected to the resistor 213 at the not-grounded end thereof, and the output of the same being connected to the emitter at the position signal switching circuit 205 through a low-pass filter 221.

Next, explanation will be given on operation of the circuit. The armature current flows in a route of output transistor group 206→windings 203→output transistor group 208→resistor 213, and is controlled by the negative feedback loop composed of differential amplifying circuit 204, position signal switching circuit 207, output transistor group 208 and resistor 213 so that a differential input of differential amplifying circuit becomes zero. Now, assuming that the transistors $Q_3$ and $Q_4$ among output transistors $Q_1$ through $Q_6$ are only in conductive condition from the positional relation between the rotor 201 and the armature windings 203, the emitter current of transistor $Q_4$ alone flows in the resistor 213. The base current from transistor $Q_4$ is fed from the current output terminal 219 of differential amplifying circuit 204, a current of the equal intensity to the above being supplied to the resistance 217. Now, when the resistance values 213 and 217 and values of flowing currents therein are presented by $R_{213}$, $R_{27}$, $I_{213}$ and $I_{217}$ respectively, input voltage $V_{220}$ of differential amplifier 220 is given by the following equation:

$$V_{220} = R_{217} \cdot I_{217} - R_{213} \cdot I_{213} \tag{5}$$

When $K \equiv I_4/I_{213}$ is given, the current amplification factor $h_{FE}$ of transistor $Q_4$ is given by $h_{FE} = I_{213}/I_4 - 1$, i.e., $$h_{FE} = 1/K - 1 \tag{6}$$

From $I_4 = I_{217}$, the equation (5) is rewritten as follows:

$$V_{220} = \left( \frac{R_{217}}{1 + h_{FE}} - R_{213} \right) \cdot I_{213} \tag{7}$$

Since, $h_{FE}$ of transistor $Q_4$ changes corresponding to the collector-emitter voltage $V_{CB}$, when the negative feedback loop comprising the differential amplifier 220, low-pass filter 221, position signal switching circuit 205, output transistor $Q_3$, windings $L_1$ and $L_3$, output transistor $Q_4$ and resistor 213, is high enough in loop gain, the collector-emitter operating voltage of transistor $Q_4$ is automatically adjusted to make input voltage $V_{220}$ zero. Accordingly from the equation (7), the following equation:

$$h_{FE} = R_{217}/R_{213} - 1 \tag{8}$$

is obtained. Since the right side thereof is constant, $h_{FE}$ of transistor $Q_4$ becomes constant, whereby $K = R_{213}/R_{217}$ is obtained. Upon changing the torque command voltage, the emitter current of transistor $Q_4$ is changed and the collector-emitter voltage of transistor $Q_4$ is automatically changed as seen from FIG. 2. In other words, the transistor $Q_4$ is automatically controlled of its collector-emitter voltage corresponding to the emitter current so that the current amplification factor is kept constant, whereby potential across both ends of windings $L_1$ and $L_3$ is adjusted corresponding to the armature current and the brushless motor stably operates.

When the values of resistance 223 and 224 are represented by $R_{223}$ and $R_{224}$, and voltage of the input (+) at the non-inversion side and of that (−) at the inversion side of differential amplifier circuit 204, by $V_{215}$ and $V_{222}$ respectively, the following equation is adapted to be obtained:

$$\frac{R_{223}}{R_{224}} = \frac{K}{1-K} = \frac{R_{213}}{R_{217} - R_{213}} \tag{9}$$

Furthermore, when the collector current of transistor $Q_4$, in other words, a current flowing in the armature winding 203 is represented by $I_a$, the following equations should hold:

$$I_a = \frac{h_{FE}}{1 + h_{FE}} \cdot I_{213} \tag{10}$$

$$V_{222} = \frac{R_{224}}{R_{223} + R_{224}} \cdot R_{213} \cdot I_{213}, \tag{11}$$

and $$V_{215} - V_{222} = 0 \tag{12}$$

From these equations, $$I_a = V_{215}/R_{213} \tag{13}$$

is obtained. This means that the current $I_a$ flowing in the armature winding 203 to contribute to generation of torque is given by the quotient after dividing the torque command input voltage $V_{215}$ by the resistance value $R_{213}$, resulting in that the generated torque is controllable simply and accurately by the torque command input voltage. The rotational positions of rotor 201 and armature winding 203 change as the motor rotates, so that even when the transistors conductive among transistors $Q_1$ through $Q_6$ change, the same operation as the above allows the operating potentials of windings $L_1$, $L_2$ and $L_3$ to change stably corresponding to the winding current.

Figure 8:
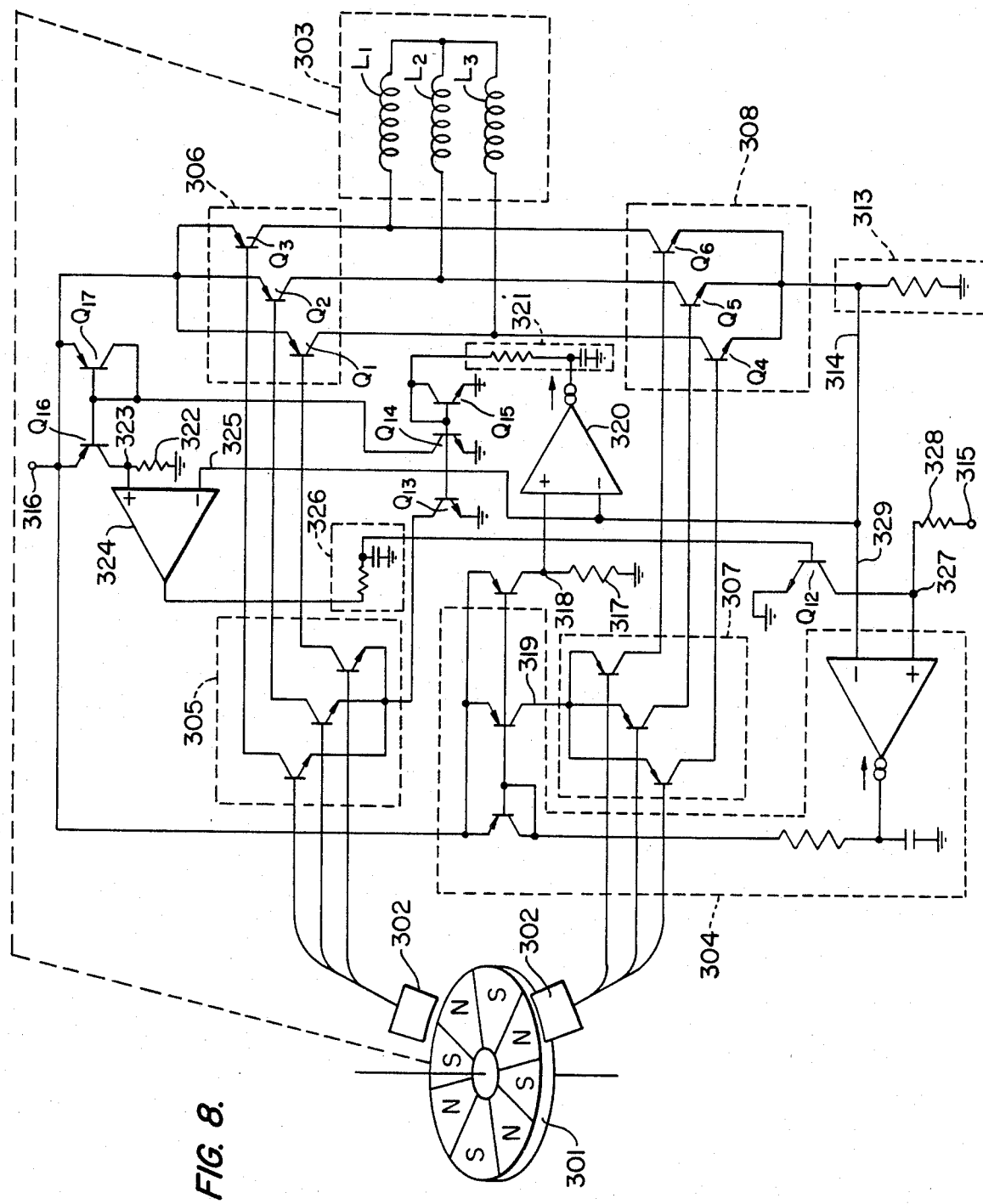

Still another modified embodiment of the brushless motor of the invention will be shown in FIG. 8, in which a permanent magnet rotor 301 is magnetized into eight poles and a 3-phase armature winding 303 comprises windings $L_1$, $L_2$ and $L_3$ connected at one ends in common. The rotational positions of rotor 301 and armature winding 303 are detected by position detectors 302 and applied as the 3-phase signals to position signal switching circuits 305 and 307 respectively, the position signal switching circuit 305 being of 3-differential constitution by NPN transistors and driving an output transistor group 306, the position signal switching circuit 307 being of 3-differential constitution and driving an output transistor group 308, the output transistor group 306 comprising PNP transistors $Q_1$, $Q_2$ and $Q_3$ connected at the emitters thereof in common to a power supply 316, the output transistor group 308 comprising NPN transistors connected at the emitters thereof in common to a current detecting resistor 313. The transistors $Q_1$ and $Q_4$, $Q_2$ and $Q_5$, and $Q_3$ and $Q_6$, are of push pull construction and connected at the collectors with each other and in common to the windings $L_3$, $L_2$ and $L_1$. The input 327 at the non-inversion side of differential amplifier circuit 304 having current output terminals 318 and 319 is connected to a torque command voltage supply terminal 315 through a resistance 328, the input 329 at the inversion side of the same being connected to the node 314 of resistor 313 and the common emitter of output transistor group 308.

The current output terminal 319 is connected to the common emitter at the position signal switching circuit 307, the current output terminal 318 being connected, together with a resistance 317 grounded at one end, to the input at the non-inversion side of differential amplifier 320. The input at the inversion side of differential amplifier 320 is connected to the node 314 of resistor 313 and transistor group 308, the output of the same being connected to the emitter of position signal switching circuit 305 through the low-pass filter 321 and current mirror transistors $Q_{15}$ and $Q_{13}$. The transistor $Q_{14}$ together with transistors $Q_{15}$ and $Q_{13}$ constitute a current mirror, and those $Q_{13}$ and $Q_{14}$ output equal currents, the collector of transistor $Q_{14}$ being connected to the common base of transistors $Q_{16}$ and $Q_{17}$. The transistors $Q_{16}$ and $Q_{17}$ are connected at the emitters thereof in common to a power supply 316, the transistor $Q_{17}$ being diode-connected to constitute the current mirror. The collector of transistor $Q_{16}$ is grounded through a resistance 322 and connected to the input 323 at the non-inversion side of differential amplifier 324, the inversion side input 325 thereof being connected to the node 314 of resistance 313 and the output of the amplifier 324 being connected to the base of transistor $Q_{12}$ through a filter 326; the transistor $Q_{12}$ is grounded at the emitter and connected at the collector to the input 327 at the non-inversion side of differential amplifier to constitute a limiter together with the resistance 328.

Next, explanation will be given on operation of the brushless motor of the invention shown in FIG. 8, in which the armature current flows in the route of the output transistor group 306→winding 303→output transistor group 308→resistor 313, and controlled by the negative feedback loop comprising the differential amplifier circuit 304, position signal switching circuit 307 and output transistor group 308 so that the differential input of differential amplifier circuit 304 becomes zero. Now, when the positional relationship between the rotor 301 and the armature winding 303 is such that only the transistors $Q_3$ and $Q_4$ from among the output transistors $Q_1$ through $Q_6$ are made conductive, only the emitter current of transistor $Q_4$ flows in the resistor 313; the base current $I_4$ of transistor $Q_4$ is fed from the current output terminal 319 of differential amplifier circuit 304 and a current of the intensity equal to above is fed to the resistance 317 from the current output terminal 318. When values of resistances 313 and 317 and current values therefor are represented by $R_{313}$, $R_{317}$, $I_{313}$ and $I_{317}$ respectively, input voltage $V_{320}$ of differential amplifier 320 is given by the following equation:

$$V_{320} = R_{317} \cdot I_{317} - R_{313} \cdot I_{313} \quad (14).$$

Also, assuming $K \equiv I_4/I_{313}$, the current amplification factor $h_{FE}$ of transistor $Q_4$ can be expressed by $$h_{FE} = I_{313}/I_4 - 1,$$

i.e., $$h_{FE} = 1/K - 1 \quad (15).$$

From $I_4 = I_{317}$, the equation (14) is rewritten as follows:

$$V_{320} = \left( \frac{R_{317}}{1 + h_{FE}} - R_{313} \right) \cdot I_{313}. \quad (16)$$

Since $h_{FE}$ of transistor $Q_4$, as shown in FIG. 2, changes as the collector-emitter voltage $V_{CE}$ changes, when the negative feedback loop comprising the differential amplifier 320, low-pass filter 321, position signal switching circuit 305, output transistor $Q_3$, windings $L_1$ and $L_3$, output transistor $Q_4$ and resistor 313, is high enough in loop gain, the collector-emitter operating voltage of transistor $Q_4$ is automatically adjusted so that the input voltage $V_{320}$ becomes zero. Accordingly, the equation 16 is rewritten as follows:

$$h_{FE} = R_{317}/R_{313} - 1 \quad (17).$$

Since, the right side of equation (17) is constant, $h_{FE}$ of transistor $Q_4$ is constant to obtain $K = R_{313}/R_{317}$. In a case where the transistor $Q_{12}$ is off, if the torque command voltage changes, the emitter current of transistor $Q_4$ changes, thereby automatically changing the collector-emitter voltage as seen from FIG. 2. In other words, since the transistor $Q_4$ is automatically controlled of its collector-emitter voltage so as to keep constant the current amplification factor, potentials across both ends of windings $L_1$ and $L_3$ are adjusted corresponding to the armature current, thereby performing stable operation.

The collector-emitter voltage of transistor $Q_3$ lowers by an increment of inversely generated voltage in the armature windings as the number of rotations of motor increases, or an increment in DC voltage drop of armature windings as the armature current increases. When the collector-emitter voltage of transistor, as shown in FIG. 2, is reduced, the current amplification factor also lowers to thereby increase the base current of transistor $Q_3$ in comparison with the collector current thereof. The base current $I_3$ of transistor $Q_3$ is supplied from the transistor $Q_{13}$ through the position signal switching circuit 305 and equal in intensity to the collector current of transistor $Q_{14}$, the collector current of transistor $Q_{14}$ being given to the resistance 322 through the current mirror transistors $Q_{17}$ and $Q_{16}$. Hence, when the current value of resistance 322 is represented by $I_{322}$, the following equation is obtained:

$$I_{322} = I_3 \quad (18).$$

On the other hand, the collector current $I_{c3}$ of transistor $Q_3$ becomes the collector current of transistor $Q_4$ through the windings $L_1$ and $L_3$ and the current amplification factor $h_{FE}$ of transistor $Q_4$ is kept in the value of the equation (17), whereby the following equation is given:

$$I_{313} = \frac{1 + h_{FE}}{h_{FE}} \cdot I_{c3} \quad (19)$$

$$= \frac{R_{317}}{R_{317} - R_{313}} \cdot I_{c3}.$$

The differential input $V_{324}$ of differential amplifier 324, when the value of resistance 322 is represented by $R_{322}$, can be expressed from the equations (18) and (19) as follows:

$$V_{324} = R_{322} \cdot I_3 - R_{313} \cdot \frac{R_{317}}{R_{317} - R_{313}} \cdot I_{c3}. \quad (20)$$

Since the transistor $Q_{12}$ is off when the right side of equation 20 is in a negative condition, whereby the torque command voltage 315 is applied to the differential amplifying circuit 304 without attenuation. The collector-emitter voltage of transistor $Q_3$, however, decreases and the base current $I_3$ increases, so that when the right side of equation (20) becomes plus, the output of differential amplifier 324 drives the transistor $Q_{12}$ to flow the collector current. As a result, the torque command voltage 315 is restricted to be reduced only to an extent of voltage drop of resistance 328 by the collector current of transistor $Q_{12}$, and applied to the differential amplifying circuit 304. Hence, the negative feedback loop comprising the differential amplifying circuit 304, position signal switching circuit 307, output transistor group 308 and resistor 313, reduces a current flowing therein. In other words, since the armature current decreases, the collector-emitter voltage of transistor $Q_3$ increases and the base current decreases.

Thus, the above operation performs automatic control to make zero the differential input 324 of differential amplifier 324. In this case, the current amplification factor of transistor $Q_3$, when represented by $h_{FE3}$, is given by the following equation:

$$h_{FE3} = \frac{R_{322}(R_{317} - R_{313})}{R_{313} \cdot R_{317}}, \quad (21)$$

and becomes a constant value depending on the values of resistances $R_{313}$, $R_{317}$ and $R_{322}$.

In other words, the transistor $Q_4$, is controlled to be always constant in current amplification factor $h_{FE}$ and that $Q_3$ changes in the current amplification factor corresponding to the torque command voltage, but the torque command input is limited to maintain the predetermined value:

$$\frac{R_{322}(R_{317} - R_{313})}{R_{313} \cdot R_{317}},$$

thereby restricting increment in the armature current and allowing the transistors $Q_3$ and $Q_4$ to always operate in the active region.

Also, the filter 326 is a low-pass filter for improving the stability of negative feedback loop including the differential amplifier 324.

Figure 9:
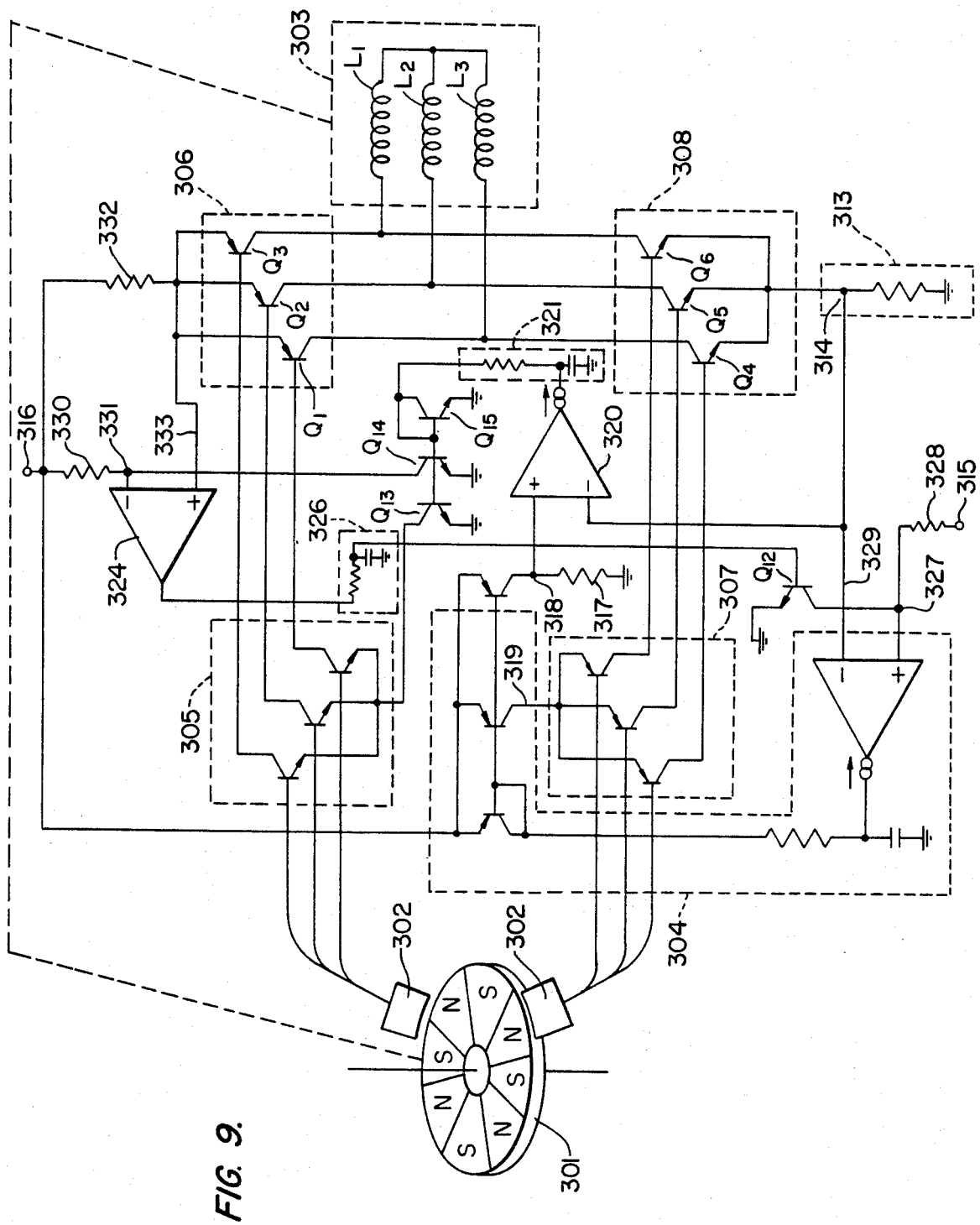

Next, a further modified embodiment of the invention will be described in accordance with FIG. 9, in which the components the same as those in FIG. 8 are omitted of explanation. The collector of transistor $Q_{14}$ is connected to a power supply 316 through a resistance 330 and also to the input 331 at the invention side of a differential amplifier 324, the common emitter of transistor group 306 being connected to the power supply 316 through a resistance 332 and also to the input 333 at the non-inversion side of differential amplifier 324. A current equal in intensity to the base current $I_3$ of transistor $Q_3$ flows in the resistance 330 by the transistor $Q_{14}$, the emitter current of transistor $Q_3$ flowing in the resistance 332. When values of resistances $R_{330}$ and $R_{332}$ are represented by $R_{330}$ and $R_{332}$ respectively, the differential input 324 of differential amplifier 324 is given by the equation:

$$V_{324} = R_{330} \cdot I_3 - R_{332} \cdot I_{332} \quad (22),$$

where $I_{332}$ is a current flowing in the resistance 332.

Now, when the number of rotations of motor or the armature current increases to increase voltages across both ends of windings $L_1$ and $L_3$, the collector-emitter voltage of transistor $Q_3$ is reduced. Then, the current amplification factor of transistor $Q_3$, as shown in FIG. 2, lowers to increase the base current. Thus, $$I_3 > \frac{R_{322}}{R_{330}} \cdot I_{332} \quad (23)$$

is given to make $V_{324}$ positive so that the output of differential amplifier 324 drives the transistor $Q_{12}$, whereby the collector current thereof flows.

As a result, the torque command voltage 315 is limited to decrease only to an extent of voltage drop at the resistance 328 by the collector current of transistor $Q_{12}$ and also a current of resistor 313. Accordingly, the armature current is also limited and the collector-emitter voltage of transistor $Q_3$ increases, whereby the current amplification factor of transistor $Q_3$ increases and the base current decreases. Such negative feedback controls the differential input $V_{324}$ of differential amplifier 324 to be zero. Since the current amplification factor $h_{FE3}$ of transistor $Q_3$ is given by $(I_{332}/I_3 - 1)$, the following equation is obtained from the equation (22):

$$h_{FE3} = R_{330}/R_{332} - 1 \quad (24),$$

thus being constant.

In other words, when the transistor $Q_3$ operates at the current amplification factor larger than that given in the equation (24), the transistor $Q_{12}$ is off and the torque command voltage 315 is not limited, whereby torque generated by the motor, i.e., armature current, is controlled by the torque command voltage. When voltages across both ends of armature windings $L_1$ and $L_3$ become larger and the collector-emitter voltage of transistor $Q_3$ decreases, the torque command voltage is attenuated to limit the armature current so that the transistor $Q_3$ maintains the current amplification factor expressed by the equation (24).

Figure 10:
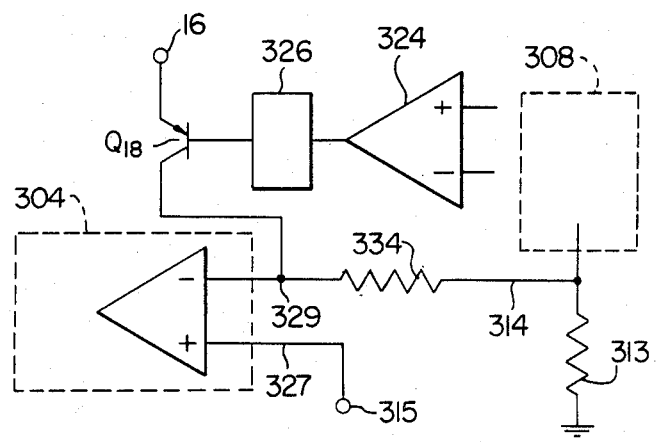
FIG. 10 is a circuit diagram of a limiter shown in the FIG. 9 embodiment.

FIG. 10 is a view of another example of the limiter, in which the input 329 at the inversion side of differential amplifying circuit 304 is connected to the node of resistor 313 and transistor group 308 through the resistance 334 and also to the collector of a transistor $Q_{18}$ connected at the emitter thereof to the power supply 316. The base of transistor $Q_{18}$ is connected to the output of differential amplifier 324 through a filter 326, the torque command voltage 315 being connected to the input 327 at the non-inversion side of differential amplifying circuit 304.

The output signal of the differential amplifier 324 drives the base of transistor $Q_{18}$ and the collector current of transistor $Q_{18}$ flows in the resistance 334 to generate a voltage drop. Since voltage at the current detecting resistor 313 is added only with the voltage drop so as to be applied to the differential amplifying circuit 304, the negative feedback loop including the differential amplifying circuit 304 reduces the current flowing in resistor 313, i.e., the armature current. Since the transistor $Q_{18}$, when off, is not at all limited by resistance 334, it is apparent that the armature current changes corresponding to the torque command voltage 315.

In the above embodiment, even when the rotational positions of rotor 301 and armature winding 303 change following the rotation of motor and the conductive transistors among those $Q_1$ through $Q_6$ vary, the same operation as the above allows the windings $L_1$, $L_2$ and $L_3$ to change in operating potential stably corresponding to the winding current.

Figure 11:
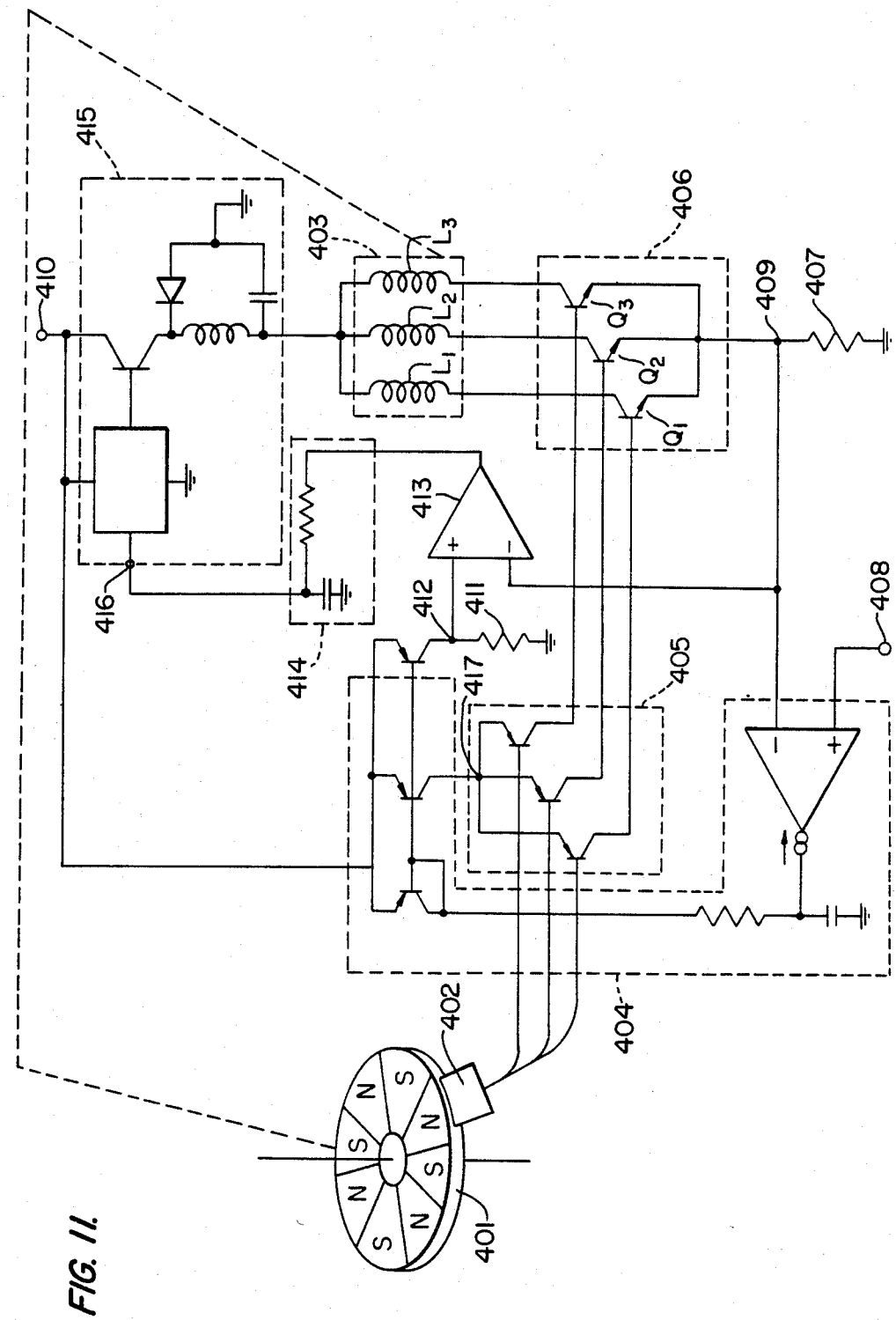
FIGS. 11 and 12 are circuit diagrams of a modified embodiment of the brushless motor of the invention.

A still further modified embodiment of the invention will be shown in FIG. 11, in which a permanent magnet rotor 401 is magnetized into eight poles, 3-phase armature winding 403 comprise windings $L_1$, $L_2$ and $L_3$ connected at one ends in common to an output of a switching mode power supply 415. The rotational positions of rotor 401 and armature windings 403 are detected by a position detector 402 and applied as the 3-phase signal to a position signal switching circuit 405, the position signal switching circuit 405 being of 3-differential constitution by PNP transistors and driving the output transistor group 406, the output transistor group 406 comprising NPN transistors $Q_1$, $Q_2$ and $Q_3$. The input (+) at the non-inversion side of differential amplifying circuit 404 having two current output terminals 412 and 417 due to the current mirror is connected to a supply terminal of torque command voltage 408, the input (−) at the inversion side of the same being connected to the node of resistance 407 and common emitter of output transistor group 406. The output terminal 417 is connected to the common emitter of position signal switching circuit 405, the output terminal 412 being connected, together with a resistance 411 grounded at one end, to the input (+) at the non-inversion side of differential amplifier 413, the inversion side input (−) thereof being connected to the node 409 of resistance 407 and transistor group 406, the output of the same being connected to the voltage control input 416 of switching mode power supply 415 through a low-pass filter 414.

Next, explanation will be given on operation of the FIG. 11 embodiments. The armature current flows in the route of switching mode power supply 415→windings 403→output transistor group 406→resistance 407, and is controlled by the negative feedback loop comprising the differential amplifying circuit 404, position signal switching circuit 405, output transistor group 406 and resistance 407, so that the differential input of differential amplifying circuit 404 becomes zero. Now, assuming that the positional relation between the rotor 401 and the armature windings 403 allows the transistor $Q_1$ only to be conductive among the output transistors $Q_1$ through $Q_3$, the emitter current of transistor $Q_1$ only flows in the resistance 407 and the base current $I_1$ of transistor $Q_1$ is supplied from the current output terminal 417 at the differential amplifying circuit 404, a current of the equal intensity to the above being given also from the current output terminal 412 to the resistance 411. When values of resistances 407 and 411 and value of flowing current are represented by $R_{407}$, $R_{411}$, $I_{407}$ and $I_{411}$, the input voltage $V_{413}$ to the differential amplifier 413 is given by $$V_{413} = R_{411} \cdot I_{411} - R_{407} \cdot I_{407} \qquad (25).$$

Also, assuming $K = I_1/I_{407}$, the current amplification factor $h_{FE}$ is written $h_{FE} = I_{407}/I_1 - 1$, i.e., $$h_{FE} = 1/K - 1 \qquad (26).$$

From $I_1 = I_{411}$, the equation (25) is rearranged as follows:

$$V_{413} = \left( \frac{R_{411}}{1 + h_{FE}} - R_{407} \right) \cdot I_{407}. \qquad (27)$$

Since $h_{FE}$ of transistor $Q_1$ changes as the collector-emitter voltage $V_{CE}$ shown in FIG. 2 changes, when the negative feedback loop comprising the differential amplifier 413, low-pass filter 414, switching mode power supply 415, winding $L_1$, output transistor $Q_1$ and resistance 407, is high enough in the loop gain, the collector-emitter operating voltage of transistor $Q_1$ is automatically adjusted to make zero the input voltage $V_{413}$. Accordingly, the equation (27) is rearranged to obtain the following equation:

$$h_{FE} = R_{411}/R_{407} - 1 \qquad (28).$$

Since the right side of equation (28) is constant, $h_{FE}$ of transistor $Q_1$ becomes constant and $K = R_{407}/R_{411}$ is given. Upon changing the torque command voltage, the emitter current of transistor $Q_1$ changes to result in that the collector-emitter voltage of transistor $Q_1$ changes automatically as shown in FIG. 2. This voltage depends on the characteristic of transistor $Q_1$ and is necessary to a minimum for flowing the predetermined emitter current, and further automatically on the variation in element and a temperature change of transistor and $h_{FE}$ is kept constant, whereby the transistor $Q_1$ is not saturated but maintains the minimum power consumption. Output voltage of switching mode power supply 415 is equal to the sum of voltage drop by the DC resistance component in the winding $L_1$, voltage drop at the resistance 407, and inverted voltage generated, so that a difference between the same and the voltage of power supply 410 becomes an internal loss of switching mode power supply 415. The power efficiency, however, is high enough due to switching mode power supply, and the power loss caused by changes in armature current, or the number of rotations of motor, is far smaller than the use of power source of serial control system, the filter 414 of low-pass filter improving the stability of negative feedback loop including the differential amplifier 413.

In the above embodiment, even when the rotational positions of rotor 401 and armature winding 403 change as the motor rotates so that the conductive transistors among those $Q_1$ through $Q_3$ change, the same operation as the above allows the operating potential of transistors $Q_1$ through $Q_3$ to change stably corresponding to the winding current.

Figure 12:
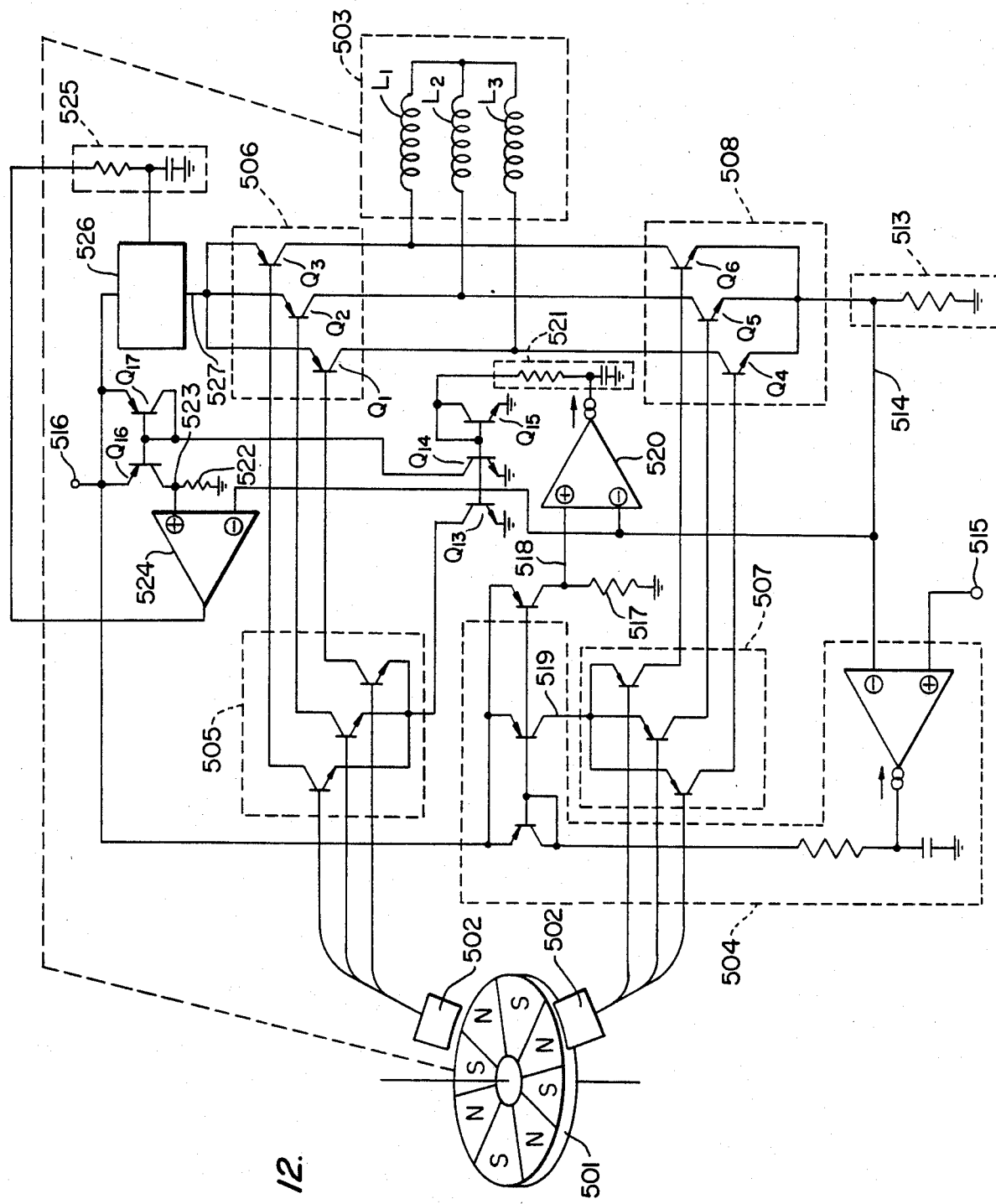

Yet another embodiment of the invention will be shown in FIG. 12, in which a permanent magnet rotor 501 is magnetized into eight poles, 3-phase armature windings 503 comprising windings $L_1$, $L_2$ and $L_3$ connected at one ends in common.

The rotational position of rotor 501 and armature winding 503 are detected by a position detector 502 and applied, as the 3-phase signal, to the position signal switching circuits 505 and 507. The position signal switching circuit 505 is of 3-differential construction by NPN transistors and serves to drive the output transistor group 506, the position signal switching circuit 507 being of 3-phase construction of PNP transistors and driving an output transistor group 508. The output transistor group 506 comprises PNP transistors $Q_1$, $Q_2$ and $Q_3$ connected at the emitters thereof in common to an output terminal 527 of switching mode power supply 526, the output transistor group 508 comprising NPN transistors $Q_4$, $Q_5$ and $Q_6$ connected at the emitters thereof in common to a current detecting resistor 513. An input (+) at the non-inversion side of differential amplifying circuit 504 having two current output terminals 518 and 519 of current mirror is connected to the supply terminal for torque command voltage 515, an input (−) at the inversion side of the same being connected to the node of resistor 513 and common emitter of output transistor group 508. The output terminal 519 is connected to the common emitter of position signal switching circuit 507, the output terminal 518 being connected to a non-inversion input (+) of differential amplifier 520 together with a resistance grounded at one end. The inversion input (−) of differential amplifier 520 is connected to the node of resistance 513 and transistor group 508, the output of the amplifier 520 being connected to the emitter of position signal switching circuit 505. A transistor $Q_{14}$ with those $Q_{15}$ and $Q_{13}$ constitute the current mirror to output equal currents from the transistors $Q_{13}$ and $Q_{14}$, the collector of transistor $Q_{14}$ connecting to the common base of transistors $Q_{16}$ and $Q_{17}$, the common emitter thereof being connected to a power supply 516, the transistor $Q_{17}$ being diode-connected to form the current mirror, the collector 523 of transistor $Q_{16}$ being grounded through a resistance 522 and connected to a non-inversion side input (+) of a differential amplifier 524, the inversion side input (−) thereof being connected to the node 514 of resistance 513 and transistor group 508, the output of the amplifier 524 being connected to a control terminal of switching mode power supply 526 through a filter 525, and the power supply terminal of switching mode power supply 526 being connected to the power supply 516.

Next, explanation will be given on operation of the FIG. 12 embodiment, in which the armature current flows in the route of switching mode power supply 526→output transistor group 506→windings 503→output transistor group 508→resistor 513, and is controlled by the negative feedback loop comprising the differential amplifying circuit 504, position signal switching circuit 507, output transistor group 508 and resistor 513, so that the differential input of differential amplifying circuit 504 becomes zero. Now, among the output transistors $Q_1$ through $Q_6$, the transistors $Q_3$ and $Q_4$ only are assumed to be in conductive condition due to the positional relation between the rotor 501 and the armature windings 503. Then, the emitter current of transistor $Q_4$ only flows in the resistor 513, and the base current $I_4$ of transistor $Q_4$ is given from the current output terminal 519 at the differential amplifying circuit 504, a current equal in intensity to the above being given to the resistance 517. When values of resistors 513 and 517 and values of currents flowing therein are represented by $R_{513}$, $R_{517}$, $I_{513}$ and $I_{517}$, input voltage $V_{520}$ at the differential amplifier 520 is given by the follow equation:

$$V_{520} = R_{517} \cdot I_{517} - R_{513} \cdot I_{513} \qquad (29).$$

Also, the current amplification factor $h_{FE}$ of transistor $Q_4$ is given by $$h_{FE} = I_{518}/I_4 - 1 \qquad (30).$$

Now, from $I_4 = I_{517}$ the equation (29) is rewritten as follows:

$$V_{520} = \left( \frac{R_{520}}{1 + h_{FE}} - R_{513} \right) \cdot I_{513}. \qquad (31)$$

Since $h_{FE}$ of transistor $Q_4$ changes following the collector-emitter voltage $V_{CE}$, when the negative feedback loop comprising the differential amplifier 520, low-pass filter 521, position signal switching circuit 505, output transistor $Q_3$, windings $L_1$ and $L_3$, output transistor $Q_4$ and resistor 513, is high enough in loop gain, the collector-emitter operating voltage of transistor $Q_4$ is adjusted so that the input voltage becomes zero. Accordingly, from the equation (31), $$h_{FE} = R_{517}/R_{513} - 1 \qquad (32)$$

is given. The right side of equation (32) is constant, whereby $h_{FE}$ of transistor $Q_4$ becomes constant. Upon changing the torque command voltage, the emitter current of transistor $Q_4$ changes and the collector-emitter voltage automatically changes. In other words, since the transistor $Q_4$ has its collector-emitter voltage automatically controlled so as to correspond to the emitter current so that the current amplification factor is kept constant, potentials across both ends of windings $L_1$ and $L_3$ are adjusted corresponding to the armature current, thereby performing the stable operation.

Increment of inverse voltage generated in the armature winding and that of DC voltage drop therein as the number of rotations of motor increases, reduce the collector-emitter voltage of transistor $Q_3$. When the collector-emitter voltage of transistor $Q_3$ decreases, the current amplification factor lowers as shown in FIG. 2, whereby the base current of transistor $Q_3$ increases in comparison with the collector current, the base current $I_3$ of transistor $Q_3$ being given from the transistor $Q_{13}$ through the position signal switching circuit 505 and being equal in intensity to the collector current of transistor $Q_{14}$, which is given to the resistance 522 through the current mirror transistors $Q_{17}$ and $Q_{16}$. Accordingly, when a current value at the resistance 522 is represented by $I_{522}$, the following equation is given:

$$I_{522} = I_3 \qquad (33).$$

On the other hand, the collector current $I_{c3}$ of transistor $Q_3$ serves as the collector current of transistor $Q_4$ through the windings $L_1$ and $L_3$ and the current amplification factor $h_{FE}$ of transistor $Q_4$ is kept in the value given in the equation (32), whereby the following equation is obtained:

$$I_{513} = \frac{1 + h_{FE}}{h_{FE}} \cdot I_{c3} \qquad (34)$$
$$= \frac{R_{517}}{R_{517} - R_{513}} \cdot I_{c3}.$$

Since the current amplification factor $h_{FE}'$ of transistor $Q_3$ is given by $h_{FE}' = I_{c3}/I_3$, therefore $$I_3 = \frac{1}{h_{FE}'} \cdot \frac{R_{517} - R_{513}}{R_{517}} \cdot I_{513} \qquad (35)$$

is obtained.

The input voltage 524 of differential amplifier 524, when a value of resistance 522 is represented by $R_{522}$, is given by $$V_{524} = R_{522} \cdot I_3 - R_{513} \cdot I_{513} \qquad (36)$$

Thus, from the equations (35) and (36), the following equation is obtained:

$$V_{524} = \left( \frac{R_{522}}{h_{FE}'} \cdot \frac{R_{517} - R_{513}}{R_{517}} - R_{513} \right) \cdot I_{513}. \qquad (37)$$

Since $h_{FE}'$ of transistor $Q_3$ changes following the collector-emitter voltage as shown in FIG. 2, when the negative feedback loop comprising the differential amplifier 524, low-pass filter 525, switching mode power supply 526, output transistor $Q_3$, windings $L_1$ and $L_3$, output transistor $Q_4$ and resistor 513, is high enough in loop gain, the collector-emitter operating voltage is automatically adjusted so that the input voltage $V_{524}$ becomes zero. Therefore, from the equation (37), $$h_{FE}' = R_{522} \cdot \frac{R_{517} - R_{513}}{R_{513} \cdot R_{517}} \qquad (38)$$

is obtained. Since the right side of equation (38) is constant, $h_{FE}'$ of transistor $Q_3$ becomes constant.

Here, the switching mode power supply 526 is adapted to change its output voltage corresponding to the control input, i.e., the output voltage level of differential amplifier 524.

When the torque command voltage 515 changes, the emitter current of transistor $Q_4$ and that of transistor $Q_3$ change and then the collector-emitter voltages of transistors $Q_3$ and $Q_4$ also automatically change, the voltages depending on the characteristics of transistors $Q_3$ and $Q_4$ and being necessary to a minimum for flowing the predetermined emitter currents respectively. Furthermore, the voltages are automatically adjusted corresponding to variations in the elements and temperature changes in the transistors and the current amplification factor is kept constant, whereby the transistors $Q_3$ and $Q_4$ are not saturated but maintain the operating condition the lowest in power consumption. Output voltage of switching mode power supply 526 becomes equal to the sum of collector-emitter voltage of transistor $Q_3$, voltage drop by DC resistance of windings $L_1$ and $L_3$, the collector-emitter voltage of transistor $Q_4$, voltage drop at resistance 513, and inverted-generated voltage of motor, so that a difference between the output voltage and the supply voltage 516 becomes an internal loss of switching mode power supply 526. However, the power efficiency regarding voltage transfer is sufficiently high because of switching mode power supply, so that the power loss caused by the change in the armature current or the number of rotations of motor is far smaller than the use of power source of serial control system. Also, a filter 525 is the low-pass filter, which improves the stability of negative feedback loop including the differential amplifier 524.

Figure 13:
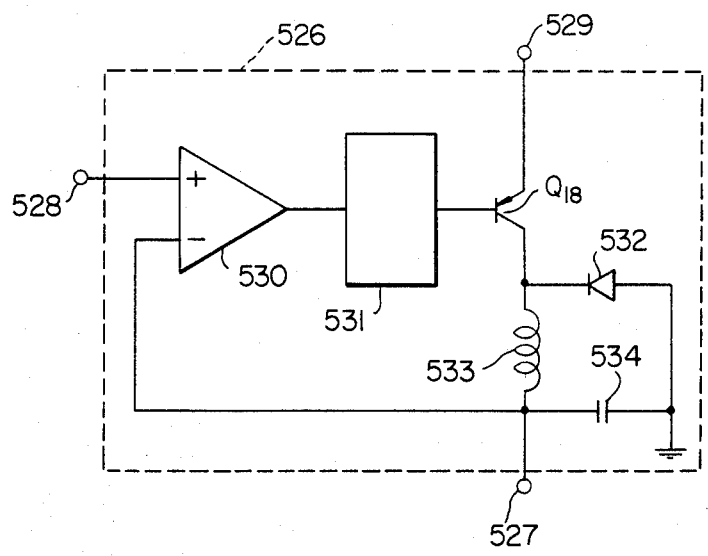
FIG. 13 is a circuit diagram exemplary of a switching mode power supply.

FIG. 13 is a view exemplary of switching mode power supply for variable output voltage, in which the collector of switching transistor $Q_{18}$ connected at the emitter thereof to an output terminal 529 is connected to an output terminal 527 through a coil 533. A diode 532 is connected at the cathode to the collector of transistor $Q_{18}$ and grounded at the anode, the output terminal 527 being grounded through a smoothing capacitor 534. The inversion input (−) at a comparator 530 is connected to an output terminal 527, the non-inversion input (+) being connected to a control terminal 528. The output of comparator 530 is applied to a control circuit 531 and further to the base of switching transistor $Q_{18}$. The control circuit 531 controls the switching state of transistor $Q_{18}$ and the output voltage is fed back to the comparator 530 through the smoothing circuit comprising the diode 532, coil 533 and capacitor 534. The negative feedback loop operates so as to make zero a difference between the voltage applied to the control terminal 528 and the output voltage, the latter following voltage at the control terminal 528.

In the above embodiment, the rotational positions of rotor 501 and armature windings 503 change following the rotation of motor, so that even when the conductive transistor among the transistors $Q_1$ through $Q_6$ changes, the same operation as the abovementioned allows the operating potentials of transistors $Q_1$ through $Q_6$ to change stably corresponding to the winding current.

Alternatively, the present invention is not defined to the 3-phase circuit. Also, this invention may of course be applicable, without changing its purpose, to various methods (for example, a current amplifying circuit is inserted into the output side of position signal switching circuit 505 or 507 so that the value of resistance 517 or 522 is increased, or a current ratio at the current output terminals 518 and 519 and current mirror transistors $Q_{13}$ and $Q_{14}$ is made a value other than 1 to thereby change values of resistances 517 and 522).

Furthermore, there are various systems for the switching mode power supply, but any of which will not hinder attainment of the purpose of this invention.

Although the invention has been described with reference to several embodiments, these embodiments are merely exemplary and not limiting of the invention which is defined solely by the appended claims.

What is claimed is:

1. An output circuit comprising: a voltage control means connected to one end of a load; a current control transistor connected to the other end of said load; first current detecting means for detecting the emitter current of said current control transistor; a first amplifier for amplifying an error between an output signal of said first current detecting means and a current command signal; a distributor for distributing the output of said first amplifier to the base of said current control transistor and a second current detecting means; a second amplifier for amplifying a difference between the output signals of said first and second current detecting means, whereby the output of said second amplifier controls said voltage control means.

2. An output circuit according to claim 1, wherein said voltage control means employs a second transistor different in conductivity from said current control transistor so that the output of said second amplifier controls a conductive condition of said second transistor.

3. An output circuit according to claim 1, wherein said voltage control means employs a switching mode power supply so that the output of said second amplifier controls output voltage of said power supply.

4. An output circuit according to claim 1, wherein said distributor employs a two-output current mirror circuit.

5. An output circuit according to claim 1, wherein said distributor employs a third transistor so that the collector and emitter thereof is used as the output of said distributor.

6. An output circuit according to claim 2, wherein said distributor employs a two-output current mirror circuit.

7. An output circuit according to claim 3, wherein said distributor employs a two-output current mirror circuit.

8. An output circuit according to claim 2, wherein said distributor employs a third transistor so that the collector and emitter thereof is used as the output of said distributor.

9. An output circuit according to claim 3, wherein said distributor employs a third transistor so that the collector and emitter thereof is used as the output of said distributor.

* * * * *